(12) United States Patent
Bilski

(10) Patent No.: US 12,176,896 B2
(45) Date of Patent: Dec. 24, 2024

(54) PROGRAMMABLE STREAM SWITCHES AND FUNCTIONAL SAFETY CIRCUITS IN INTEGRATED CIRCUITS

(71) Applicant: Xilinx, Inc., San Jose, CA (US)

(72) Inventor: Karl Henrik Goran Bilski, Molndal (SE)

(73) Assignee: Xilinx, Inc., San Jose, CA (US)

( * ) Notice: Subject to any disclaimer, the term of this patent is extended or adjusted under 35 U.S.C. 154(b) by 133 days.

(21) Appl. No.: 18/062,828

(22) Filed: Dec. 7, 2022

(65) Prior Publication Data

US 2024/0195418 A1 Jun. 13, 2024

(51) Int. Cl.
| | |
|---|---|
| H03K 19/0175 | (2006.01) |
| H03K 19/17736 | (2020.01) |
| H03K 19/17764 | (2020.01) |
| H03K 19/17768 | (2020.01) |

(52) U.S. Cl.
CPC ........... *H03K 19/017581* (2013.01); *H03K 19/17744* (2013.01); *H03K 19/17764* (2013.01); *H03K 19/17768* (2013.01)

(58) Field of Classification Search
None
See application file for complete search history.

(56) References Cited

U.S. PATENT DOCUMENTS

| | | | |
|---|---|---|---|
| 3,776,137 A | 12/1973 | Abbott | |
| 4,876,641 A | 10/1989 | Cowley | |
| 6,091,263 A | 7/2000 | New et al. | |
| 6,150,839 A | 11/2000 | New et al. | |
| 6,204,687 B1 | 3/2001 | Schultz et al. | |
| 6,462,579 B1 | 10/2002 | Camilleri et al. | |
| 6,526,557 B1 | 2/2003 | Young et al. | |
| 6,759,869 B1 | 7/2004 | Young et al. | |
| 6,781,407 B2 | 8/2004 | Schultz | |

(Continued)

FOREIGN PATENT DOCUMENTS

| | | | |
|---|---|---|---|
| WO | 2019195132 A1 | 10/2019 | |
| WO | 2019195309 A1 | 10/2019 | |
| WO | 2019195343 A1 | 10/2019 | |

OTHER PUBLICATIONS

ARM Limited, "AMBA 3 APB Protocol Specification," v1.0, Sep. 25, 2003, pp. 1-34, ARM Limited, Cambridge, UK.

(Continued)

*Primary Examiner* — Jany Richardson
(74) *Attorney, Agent, or Firm* — Kevin T. Cuenot

(57) ABSTRACT

An integrated circuit (IC) may include a plurality of compute tiles in a data processing array. Each compute tile is configured to perform a data processing function. The IC may include a plurality of interface tiles in the data processing array. The plurality of interface tiles are communicatively linked to the plurality of compute tiles. The IC may include a plurality of programmable stream switches disposed in the plurality of compute tiles and the plurality of interface tiles. The IC may include a functional safety circuit. The functional safety circuit is connected to a selected programmable stream switch of the plurality of programmable stream switches. The functional safety circuit is configured to perform a functional safety function on a plurality of data streams routed to the functional safety circuit from the selected programmable stream switch.

20 Claims, 6 Drawing Sheets

(56) References Cited

U.S. PATENT DOCUMENTS

| | | |
|---|---|---|
| 6,810,514 B1 | 10/2004 | Alfke et al. |
| 6,836,842 B1 | 12/2004 | Guccione et al. |
| 6,907,595 B2 | 6/2005 | Curd et al. |
| 7,024,651 B1 | 4/2006 | Camilleri et al. |
| 7,057,413 B1 | 6/2006 | Young et al. |
| 7,124,338 B1 | 10/2006 | Mark et al. |
| 7,185,309 B1 | 2/2007 | Kulkarni et al. |
| 7,199,608 B1 | 4/2007 | Trimberger |
| 7,224,184 B1 | 5/2007 | Levi et al. |
| 7,281,093 B1 | 10/2007 | Kulkarni et al. |
| 7,301,822 B1 | 11/2007 | Walstrum, Jr. et al. |
| 7,302,625 B1 | 11/2007 | Payakapan et al. |
| 7,454,658 B1 | 1/2008 | Baxter |
| 7,328,335 B1 | 2/2008 | Sundararajan et al. |
| 7,380,035 B1 | 5/2008 | Donlin |
| 7,394,288 B1 | 7/2008 | Agarwal |
| 7,420,392 B2 | 9/2008 | Schultz et al. |
| 7,477,072 B1 | 1/2009 | Kao et al. |
| 7,478,357 B1 | 1/2009 | Mason et al. |
| 7,482,836 B2 | 1/2009 | Levi et al. |
| 7,500,060 B1 | 3/2009 | Anderson et al. |
| 7,509,617 B1 | 3/2009 | Young et al. |
| 7,518,396 B1 | 4/2009 | Kondapalli et al. |
| 7,521,961 B1 | 4/2009 | Anderson |
| 7,539,845 B1 | 5/2009 | Wentzlaff et al. |
| 7,546,572 B1 | 6/2009 | Ballagh et al. |
| 7,574,680 B1 | 8/2009 | Kulkarni et al. |
| 7,576,561 B1 | 8/2009 | Huang |
| 7,619,442 B1 | 11/2009 | Mason et al. |
| 7,640,527 B1 | 12/2009 | Dorairaj et al. |
| 7,650,248 B1 | 1/2010 | Baxter |
| 7,653,820 B1 | 1/2010 | Trimberger |
| 7,689,726 B1 | 3/2010 | Sundararajan et al. |
| 7,724,815 B1 | 5/2010 | Raha et al. |
| 7,746,099 B1 | 6/2010 | Chan et al. |
| 7,774,579 B1 | 8/2010 | Wentzlaff |
| 7,788,625 B1 | 8/2010 | Donlin et al. |
| 7,831,801 B1 | 11/2010 | Anderson |
| 8,006,021 B1 | 8/2011 | Li et al. |
| 8,020,163 B2 | 9/2011 | Nollet et al. |
| 8,045,546 B1 | 10/2011 | Bao et al. |
| 8,058,916 B2 | 11/2011 | Steiner |
| 8,102,188 B1 | 1/2012 | Chan et al. |
| 8,214,694 B1 | 7/2012 | McKechnie et al. |
| 8,250,342 B1 | 8/2012 | Kostamov et al. |
| 8,359,448 B1 | 1/2013 | Neuendorffer |
| 8,415,974 B1 | 4/2013 | Lysaght |
| 8,443,230 B1 | 5/2013 | James-Roxby et al. |
| 8,479,042 B1 | 7/2013 | James-Roxby et al. |
| 8,656,141 B1 | 2/2014 | Agarwal |
| 8,719,750 B1 | 5/2014 | Balzli, Jr. |
| 8,796,539 B2 | 8/2014 | Asaumi et al. |
| 8,928,351 B1 | 1/2015 | Konduru |
| 9,081,634 B1 | 7/2015 | Simkins et al. |
| 9,152,794 B1 | 10/2015 | Sanders et al. |
| 9,165,143 B1 | 10/2015 | Sanders et al. |
| 9,218,443 B1 | 12/2015 | Styles et al. |
| 9,230,112 B1 | 1/2016 | Peterson et al. |
| 9,323,876 B1 | 4/2016 | Lysaght et al. |
| 9,336,010 B2 | 5/2016 | Kochar et al. |
| 9,411,688 B1 | 8/2016 | Poolla et al. |
| 9,436,785 B1 | 9/2016 | Javre |
| 9,639,487 B1 | 5/2017 | Wentzlaff |
| 9,652,252 B1 | 5/2017 | Kochar et al. |
| 9,652,410 B1 | 5/2017 | Schelle et al. |
| 9,722,613 B1 | 8/2017 | Schultz et al. |
| 9,990,241 B2 | 6/2018 | Dobbs |
| 10,078,565 B1 * | 9/2018 | Petersson .............. G06F 11/181 |
| 10,243,882 B1 | 3/2019 | Swarbrick |
| 10,505,548 B1 | 12/2019 | Swarbrick |
| 10,673,439 B1 | 6/2020 | Ahmad |
| 10,747,690 B2 | 8/2020 | Bilski |
| 10,824,505 B1 | 11/2020 | Swarbrick |
| 10,824,584 B1 | 11/2020 | Noguera Serra |
| 10,838,908 B2 | 11/2020 | Swarbrick |
| 10,866,753 B2 | 12/2020 | Noguera Serra |
| 10,963,421 B1 | 3/2021 | Swarbrick |
| 11,336,287 B1 * | 5/2022 | Rodriguez .......... G06F 15/7825 |
| 11,520,717 B1 * | 12/2022 | Clarke .................... G06F 13/28 |
| 2004/0114609 A1 | 6/2004 | Swarbrick et al. |
| 2004/0210695 A1 | 10/2004 | Weber et al. |
| 2007/0006137 A1 | 1/2007 | Savagaonkar |
| 2007/0124565 A1 | 5/2007 | Jones |
| 2008/0082759 A1 | 4/2008 | Pong |
| 2008/0320255 A1 | 12/2008 | Wingard et al. |
| 2008/0320268 A1 | 12/2008 | Wingard et al. |
| 2012/0036296 A1 | 2/2012 | Wingard et al. |
| 2012/0310983 A1 | 12/2012 | Mittal |
| 2014/0006751 A1 | 1/2014 | Aliseychik et al. |
| 2014/0267334 A1 | 9/2014 | Duluk, Jr. |
| 2016/0011996 A1 | 1/2016 | Asaad et al. |
| 2017/0140800 A1 | 5/2017 | Wingard et al. |
| 2017/0220499 A1 | 8/2017 | Gray |
| 2017/0315944 A1 | 11/2017 | Mayer et al. |
| 2018/0012637 A1 | 1/2018 | Krishna |
| 2019/0155666 A1 | 5/2019 | Dobbs |
| 2019/0205263 A1 | 7/2019 | Fleming |
| 2019/0205269 A1 | 7/2019 | Fleming, Jr. |
| 2019/0238453 A1 | 8/2019 | Swarbrick et al. |
| 2019/0266125 A1 | 8/2019 | Swarbrick et al. |
| 2019/0303033 A1 | 10/2019 | Noguera Serra et al. |
| 2019/0303311 A1 | 10/2019 | Bilski et al. |
| 2019/0303323 A1 | 10/2019 | Swarbrick et al. |
| 2019/0303328 A1 | 10/2019 | Bilski et al. |
| 2020/0117554 A1 * | 4/2020 | Chaudhari .......... G06F 11/1679 |
| 2024/0028422 A1 * | 1/2024 | Agarwal ................. G06F 9/544 |

OTHER PUBLICATIONS

ARM Limited, "AMBA 4 Axis-Stream Protocol SpecificaTIon," V1.0, Mar. 3, 2010, pp. 1-42, ARM Limited, Cambridge UK.

Xilinx, Inc., "Zynq-7000 AP SoC—32 Bit DDR Access with ECC Tech Tip," 15 pg., printed on Aug. 10, 2018, <http://www.wiki.xilinx.com/Zynq-7000+AP+XoC+-+32+Bit+DDR+Access+with+ECC+Tech+Tip>, San Jose, CA, USA.

Dally, William J. et al., "Deadlock=Free Message Routing in Multiprocessor Interconnection Networks," IEEE Transactions on Computers, May 1987, pp. 547-553, vol. C-36, No. 5, IEEE, Piscataway, New Jersey, USA.

Doud, B., "Accelerating the Data Plane With the Tile-MX Manycore Processor," Feb. 25, 2015, 19 pp., Linley Data Center Conference, EZChip Semiconductor, Inc., San Jose, California, USA.

Mellanox, EZchip, "Tile-Gx72 Processor," PB041, Feb. 14, 2015, 2 pp., EZchip Semiconductor, Inc., San Jose, California, USA.

Glass, Christopher et al., "The Turn Model for Adaptive Routing," Journal of the Association for Computing Machinery, Sep. 1994, pp. 874,902, vol. 41, No. 5, ACM, New York, New York, USA.

Kalray, "Deep Learning for High-Performance Embedded Applications," 19 pp., Kalray Inc., Los Altos, California, USA.

Kalray, "Kalray NVMe-oF Target Controller Solutions," Dec. 18, 2017, 14 pp., Kalray Inc., Los Altos, California, USA.

Kalray, "MPPA Processors for Autonomous Driving," May 25, 2017, 18 pp., Kalray Inc., Los Altos, California, USA.

Mellanox, "BlueField Multicore System on Chip," copyright 2017, 4 pp., Mellanox Technologies, Sunnyvale, California, USA.

Mellanox, "NP-5 Network Processor," copyright 2017, 2 pp., Mellanox Technologies, Sunnyvale, California, USA.

ARM Limited, "AMBA AXI and ACE Protocol Specification," Jun. 16, 2003, pp. 1-306, ARM Limited, Cambridge, UK.

Rantala, Ville et al., "Network on Chip R outing Algorithms," TUCS Technical Report No. 779, Aug. 2006, pp. 1-38, Turku Centre for Computer Science, Turku, Finland.

Schooler, Richard, "Tile Processors: Many-Core for Embedded and Cloud Computing," Sep. 15, 2010, 35 pp., 14th Annual Workshop on High Performance Embedded Computing (HPEC '10).

TIS Committee, 'Tool Interface Standard (TIS) Executable and Linking Format (ELF) Specification, Version 1.2, May 1995, 106 pg, Tool Interface Standard Committee.

(56) References Cited

OTHER PUBLICATIONS

Wentzlaff, David, et al., "On-Chip Interconnection Architecture of the Tile Processor," IEEE Micro, Nov. 12, 2007, pp. 15-31, vol. 27, Issue 5, IEEE Computer Society Press, Los Alamitos, California, USA.
EZchip, "Tile-Gx72 Processor," Feb. 14, 2015, 2 pp., EZchip Semiconductor, Inc., San Jose, California, USA.
Xilinx, "UltraScale Architecture DSP Slice," UG579, Oct. 18, 2017, 74 pp., Xilinx, Inc., San Jose, California, USA.
Xilinx, Inc., "AXI4-Stream Interconnect v1.1, LogiCORE IP Product Guide," PG035, Vivado Design Suite, Chap. 2: Product Specification, Chap. 3: Designing With the Core, Oct. 4, 2017, 44 pg., Xilinx, Inc., San Jose, California, USA.
LogiCORE IP AXI Interconnect (v1.06.a), Product Specification, DS768, Dec. 18, 2012, 62 pg., Xilinx, Inc., San Jose, California.
Stocksdale et al., Architecting H BM as a High Bandwidth, High Capacity, Self-Managed Last-Level Cache, Nov. 2017, PDSW-DSICS' 17 Denver, Co, USA (Year: 2017).
Xilinx, Inc., "Versal: The First Adaptive Compute Acceleration Platform (ACAP)," WP505 (v1.1.1) Sep. 29, 2020, 21 pages.
Xilinx, Inc., "Xilinx AI Engines and Their Applications," WP506 (v1.1) Jul. 10, 2020, 13 pages.
Srinivasan, et al., Pending U.S. Appl. No. 17/957,418, filed Sep. 30, 2022, titled "Integrated Circuit Transaction Redundancy", 37 pages.
Tran, et al., Pending U.S. Appl. No. 17/746,843, filed May 17, 2022, titled "Lock-Stepping Asynchronous Logic", 31 pages.

\* cited by examiner

PROGRAMMABLE STREAM SWITCHES AND FUNCTIONAL SAFETY CIRCUITS IN INTEGRATED CIRCUITS

TECHNICAL FIELD

This disclosure relates to integrated circuits (ICs) and, more particularly, to using functional safety circuits with programmable stream switches in circuit architectures of an IC.

BACKGROUND

Integrated circuits (ICs) have evolved over time to provide increasingly sophisticated computing architectures. While some ICs utilize computing architectures that include a single processor, others include multiple processors. Still, other ICs include multiple processors arranged in an array. Such ICs are capable of providing significant computational power and a high degree of parallelism that extends well beyond the capabilities of single-processor architectures and even multi-core processor architectures.

Functional safety (FUSA) is an engineering design process that seeks to add or include mechanisms within systems and/or equipment wherein the mechanisms provide automatic protection. FUSA helps to protect people from unacceptable risk of injury or damage to health by way of implementing one or more automatic safety functions. Industries of all varieties, whether consumer appliance, automotive, or aerospace, for example, build systems and/or equipment with FUSA in mind. Examples of FUSA techniques include, but are not limited to, the use of lockstep or triple modular redundancy (TMR). Lockstep refers to two systems performing the same set of operations in parallel. The two sets of results from the two systems are compared by a checker unit or comparator to look for single point faults. TMR is where three systems perform operations in parallel. A voting mechanism is used to output the majority result from the three systems.

SUMMARY

In one or more example implementations, an integrated circuit (IC) includes a plurality of compute tiles in a data processing array. Each compute tile is configured to perform a data processing function. The IC includes a plurality of interface tiles in the data processing array. The plurality of interface tiles are communicatively linked to the plurality of compute tiles. The IC includes a plurality of programmable stream switches disposed in the plurality of compute tiles and the plurality of interface tiles. The IC includes a functional safety circuit. The functional safety circuit is connected to a selected programmable stream switch of the plurality of programmable stream switches. The functional safety circuit is configured to perform a functional safety function on a plurality of data streams routed to the functional safety circuit from the selected programmable stream switch.

The foregoing and other implementations can each optionally include one or more of the following features, alone or in combination. Some example implementations include all the following features in combination.

In some aspects, the selected programmable stream switch includes a plurality of input ports and a plurality of output ports, wherein at least two of the plurality of output ports and at least one of the plurality of input ports are connected to the functional safety circuit.

In some aspects, the selected programmable stream switch is programmable to route data received on any input port to the at least two of the plurality of output ports connected to the functional safety circuit.

In some aspects, the selected programmable stream switch is programmable to route data received on the at least one input port of the plurality of input ports connected to the functional safety circuit to a selected output port of the plurality of output ports of the selected programmable stream switch.

In some aspects, in response to detecting a fault, the functional safety circuit ignores the input port on which the fault is detected for subsequent voting operations.

In some aspects, the functional safety circuit, subsequent to detecting the fault, performs a lockstep function.

In some aspects, the functional safety circuit is a lockstep circuit.

In some aspects, the functional safety circuit is a voting circuit.

In some aspects, the functional safety circuit is configured to generate an interrupt in response to detecting a fault.

In some aspects, in response to detecting the fault, the functional safety circuit does not pass any output.

In some aspects, the functional safety circuit is programmable to implement a lockstep function or a voting function.

In some aspects, the data processing array includes a plurality of memory tiles each including a programmable stream switch, wherein one or more selected programmable stream switches disposed in the plurality of memory tiles are connected to functional safety circuits.

In some aspects, the functional safety circuit is implemented in programmable circuitry coupled to the data processing array.

In one or more example implementations, an IC includes a programmable stream switch having a plurality of input ports and a plurality of output ports. The IC includes a functional safety circuit having a plurality of input ports and an output port. The plurality of input ports of the functional safety circuit are connected to two or more output ports of the plurality of output ports of the programmable stream switch. The output port of the functional safety circuit is connected to an input port of the plurality of input ports of the programmable stream switch. The programmable stream switch is programmable to connect different ones of the plurality of input ports to different ones of the plurality of output ports to implement a functional safety function on two or more data streams received by the programmable stream switch.

The foregoing and other implementations can each optionally include one or more of the following features, alone or in combination. Some example implementations include all the following features in combination.

In some aspects, the functional safety circuit is a lockstep circuit.

In some aspects, the functional safety circuit is a voting circuit.

In some aspects, the programmable stream switch is a hardened circuit and the functional safety circuit is implemented in programmable circuitry.

In some aspects, the programmable stream switch is a hardened circuit and the functional safety circuit is a hardened circuit.

In some aspects, the programmable stream switch is implemented in programmable circuitry and the functional safety circuit is implemented in programmable circuitry.

In some aspects, the functional safety circuit is configured to generate an interrupt in response to detecting a fault.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to using functional safety circuits with programmable stream switches in circuit architectures of an IC. In accordance with the inventive arrangements described within this disclosure, methods and systems are disclosed relating to the implementation of functional safety circuits with programmable stream switches. A programmable stream switch may be incorporated into a variety of different circuit architectures. An example circuit architecture that may include a number of programmable stream switches is a processor array. A functional safety circuit may be included and connected to such programmable stream switch(es). This allows any set of data streams received at input ports of the programmable stream switch to be routed to the functional safety circuit. A result generated by the functional safety circuit may be provided to an input port of the programmable stream switch. This result may then be directed from the input port to another selected output port of the programmable stream switch so that the result may be made available to another circuit and/or system of the IC.

Further aspects of the inventive arrangements are described below with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
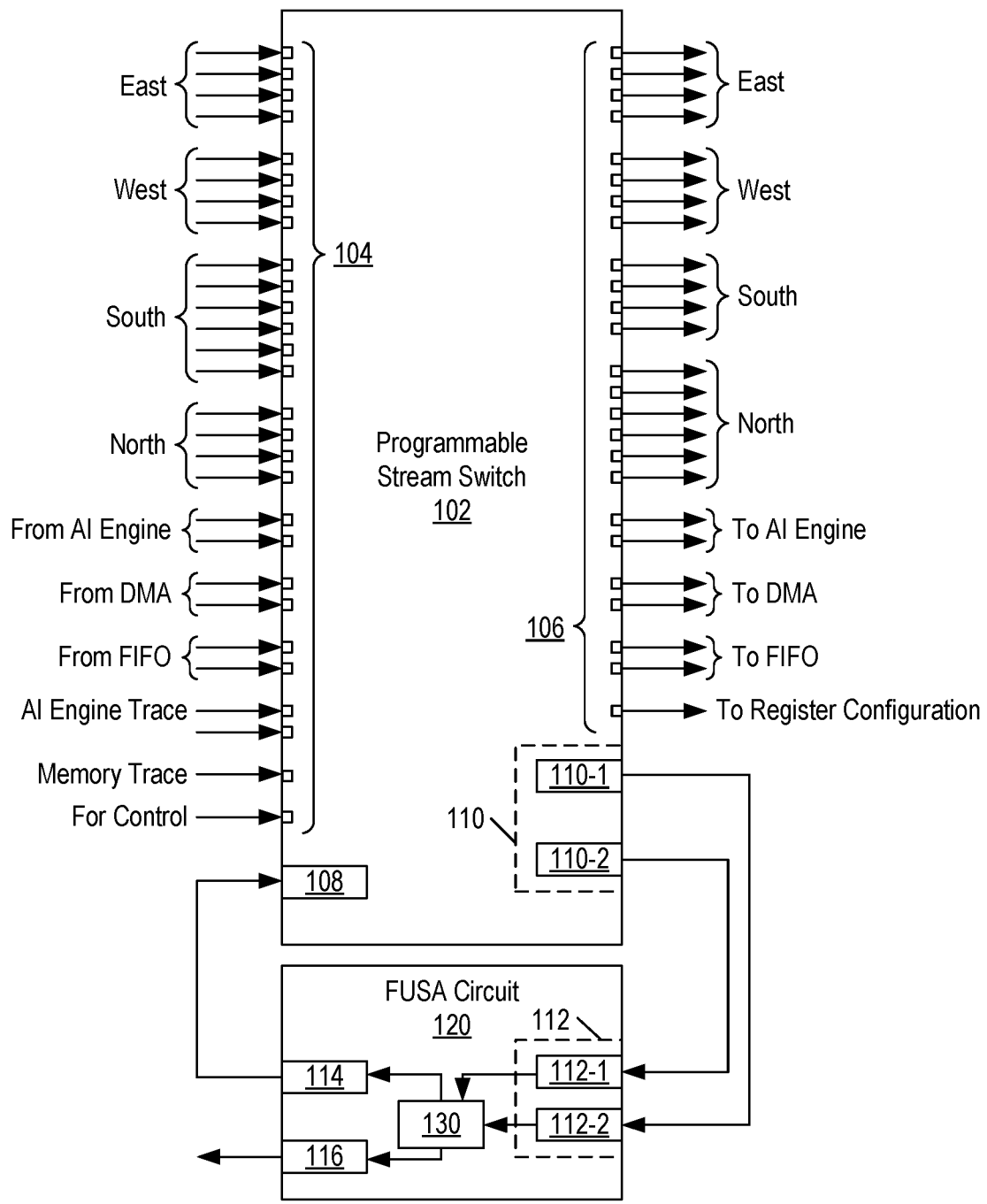
FIG. 1 illustrates an example circuit architecture including a programmable stream switch and a functional safety circuit.

FIG. 1 illustrates an example circuit architecture 100 including a programmable stream switch 102 and a functional safety (FUSA) circuit 120. In the example, the stream switch 102 includes a plurality of input ports 104 on the left side and a plurality of output ports 106 on the right side. Each input port 104 on the left side is a multi-bit input port represented by an arrow entering programmable stream switch 102. Similarly, each output port 106 on the right side is a multi-bit output port represented by an arrow exiting programmable stream switch 102. In one or more example implementations, each data stream (and input/output port) may be 32-bits in width. In one or more other example implementations, each data stream (and input/output port) may be 64-bits in width. The particular width of the data streams and/or number of input/output ports shown are for purposes of illustration and are not intended as limitations of the inventive arrangements.

In one or more example implementations, programmable stream switch 102 is implemented as an Advanced Microcontroller Bus Architecture (AMBA) eXtensible Interface (AXI) (hereafter "AXI") compliant stream switch. In one or more example implementations, programmable stream switch 102 is implemented as an AXI4-Stream interconnect or crossbar. Programmable stream switch 102 is programmable in that data received at selected ones of the input ports on the left side may be routed to selected ones of the output ports on the right side.

In the example, an additional input port 108 is added. Further, additional output ports 110-1 and 110-2 are added. Input port 108 and output ports 110 may be implemented similar to, or the same as, input ports 104 and output ports 106 of programmable stream switch 102 as previously described.

In one or more example implementations, the routing of a particular input port 104, 108 to a particular output port 106, 110 may be specified by loading configuration data into configuration registers (not shown) that control operation of programmable stream switch 102. The configuration data may specify, for example, which input port(s) 104, 108 connect to which output port(s) 106, 110 of programmable stream switch 102. In one or more other example implementations, data received at input ports 104, 108 may be routed to particular output ports 106, 110 dynamically based on the data included in a header of each received packet of data. In one or more other example implementations, one or more input ports 104, 108 may route data to selected output ports 106, 110 based on configuration data while one or more other input ports 104, 108 route data to selected output ports 106, 110 dynamically based on the data included in the headers of received data packets.

In the example of FIG. 1, programmable stream switch 102 is connected to FUSA circuit 120. FUSA circuit 120 is configured to perform a functional safety function. As shown, FUSA circuit 120 includes input ports 112-1 and 112-2 and an output port 114. FUSA circuit 120 also includes an interrupt port 116. Output ports 110-1 and 110-2 of programmable stream switch 102 are connected to input ports 112-1 and 112-2, respectively, of FUSA circuit 120.

In the example of FIG. 1, FUSA circuit 120 is implemented as a lockstep circuit capable of performing a lockstep function. A lockstep function receives two data streams (e.g., lockstep data streams), compares the content of the data streams, and implements one or more operations in response to the comparison. As illustrated, FUSA circuit 120 includes a comparison circuit 130 that is coupled to input ports 112, output port 114, and interrupt port 116. FUSA circuit 120 receives data on input port 112-1 and on input port 112-2. Comparator circuit 130 compares the received data (e.g., the content or payload of the received lockstep data streams as appreciably data on different ports may have differing header information). The lockstep data streams being compared may be generated by other duplicated circuits, systems, and/or applications that are operating in lockstep. As such, the data compared on the two input ports 112-1 and 112-2 is expected to be identical or match. FUSA circuit 120 is capable of generating different outputs on output port 114 based on a result of the comparison. For example, in response to comparator circuit 130 determining that the data received on input ports 112-1 and 112-2 matches, comparator circuit 130 outputs the data on output port 114. In one or more examples, in response to comparator circuit 130 determining that the data received on input ports 112-1 and 112-2 does not match, e.g., where a fault is detected, comparator circuit 130 may not output any data and, in response to detecting the fault, may generate an interrupt signal on interrupt port 116 indicating a particular fault or type of fault was detected.

In one or more example implementations, in response to detecting a fault, comparison circuit 130 may ignore the data received on the input port found not to match. For example, comparison circuit 130 may ignore data received on input port 112-2 for future comparisons. In one or more examples, ignoring an input port with data that is found not to match does not imply that the faulty data stream is no longer consumed. Were the faulty data stream no longer consumed by FUSA circuit 120 and/or comparison circuit 130, the faulty data stream would fill the stream network and block other correct data streams. Accordingly, the faulty data stream still may be consumed by FUSA circuit 120 and/or comparison circuit 130 presuming such data is available to prevent the faulty data stream from filling the stream network and blocking other correct data streams.

In one or more other examples, the lockstep function implemented by comparison circuit 130 may be activated or performed only in response to all received data streams having valid data. If, for example, one data stream (e.g., input port 112-1) stops sending data, comparison circuit 130 may discontinue the lockstep function and wait for valid data on the data stream (e.g., input port 112-1) that stopped sending data. In one aspect, FUSA circuit 120 may include a timeout timer circuit (not shown) that is coupled to comparison circuit 130. Comparison circuit 130 may start the timeout timer circuit in response to detecting valid data on one or more of the data streams (e.g., input ports 112). Comparison circuit 130 may reset the timeout timer circuit in response to detecting that all participating data streams having valid data. In response to the timeout timer circuit reaching a threshold count, the timeout timer circuit may trigger a error. The threshold count may be a programmable value.

In one or more examples, the programmability of programmable stream switch 102 allows data received on any two input ports 104 to be routed to output ports 110 to be provided to FUSA circuit 120 for processing. The output generated by FUSA circuit 120, at least in the case where the data matches (no fault is detected), is output from output port 114 to input port 108. Appreciably, data received on input port 108 may be routed to any one of output ports 106 of programmable stream switch 102.

Inclusion of FUSA circuit 120 in communication with programmable stream switch 102 as shown allows FUSA functions, e.g., a lockstep function, to be incorporated into any of a variety of different circuit applications running in the IC. The programmability allows selected data streams from lockstep circuits and/or applications to be routed to FUSA circuit 120. The particular data streams (duplicate or redundant) that are routed to FUSA circuit 120 may be changed during runtime or operation of the IC in which architecture 100 is included. This means that the output of different pairs of circuits, systems, and/or applications may be routed to FUSA circuit 120 over time during operation of a larger system including circuit architecture 100. The IC may be an adaptive system that is capable of implementing different circuits, systems, and/or applications in the field. Data streams from these different circuits, systems, and/or applications may be connected and/or disconnected from FUSA circuit 120 during operation of the IC in the field.

Programmable stream switch 102 is provided for purposes of illustration and not limitation. It should be appreciated that the particular number of input ports and output ports shown for programmable stream switch 102 is not intended as a limitation. Programmable stream switch 102 may include fewer or more input ports and/or output ports.

In one or more example implementations, programmable stream switch 102 and FUSA circuit 120 both are implemented as hardened (e.g., hardwired) circuit blocks. In one or more other example implementations, programmable stream switch 102 may be implemented as a hardened circuit block while FUSA circuit 120 is implemented using programmable circuitry. Programmable logic is an example of programmable circuitry. In one or more other example implementations, both programmable stream switch 102 and FUSA circuit 120 are implemented using programmable logic. It should be appreciated that in the case where programmable stream switch 102 is implemented as a hardened circuit block and FUSA circuit 120 is implemented using programmable logic, functional safety mechanisms may be added to existing programmable switching circuit architectures, e.g., in the field.

Figure 2:
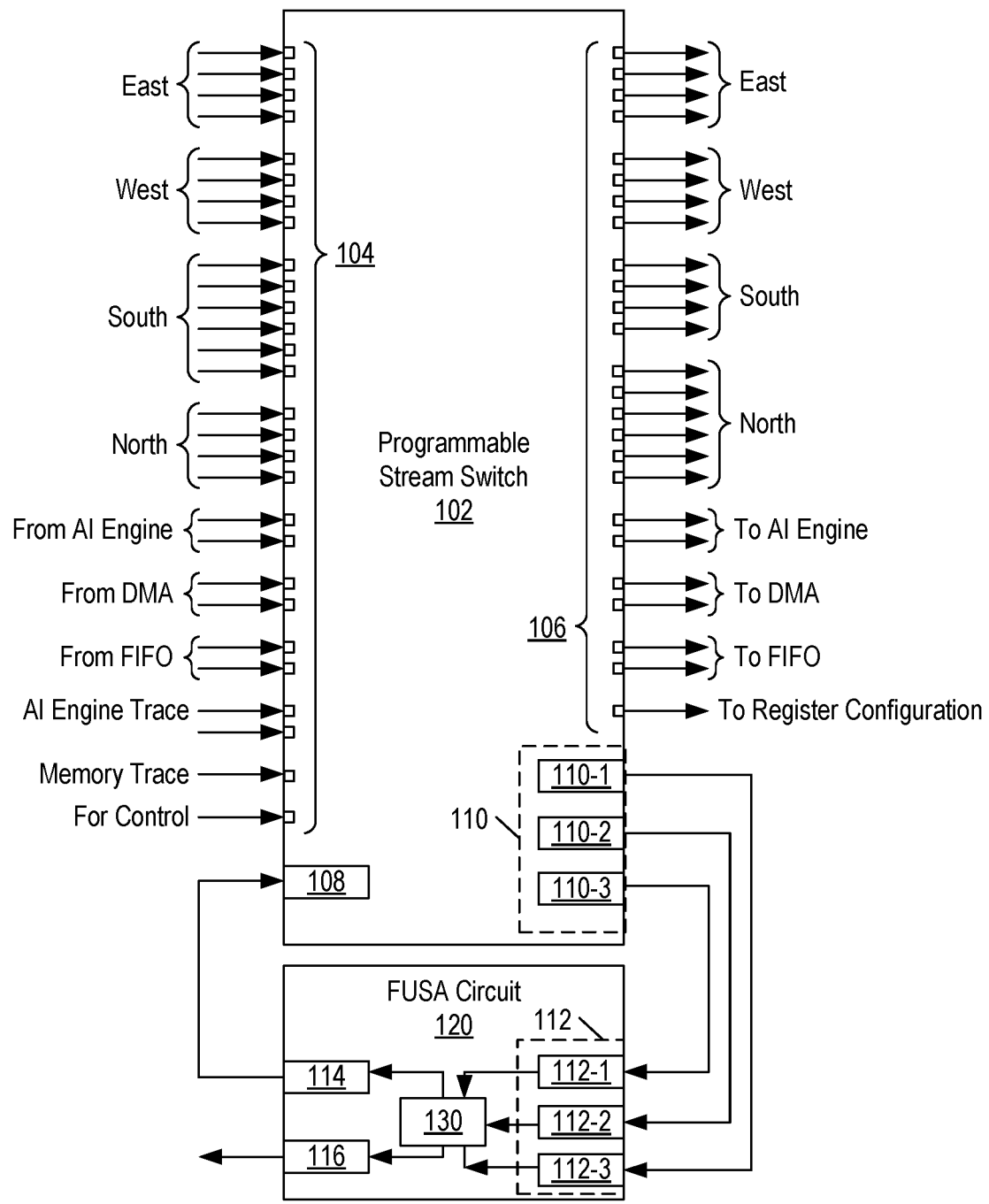
FIG. 2 illustrates another example implementation of the circuit architecture of FIG. 1.

FIG. 2 illustrates another example implementation of circuit architecture 100. Circuit architecture 100 of FIG. 2 is substantially the same as circuit architecture 100 of FIG. 2, with the exception of programmable stream switch 102 including an additional output port 110-3 and FUSA circuit 120 having an additional input port 112-3. In the example of FIG. 2, FUSA circuit 120 is implemented as a voter circuit capable of performing a voting function. In general, the voting function is similar to the lockstep function albeit with data from three data streams being compared. The data streams may be from a circuit implemented using triple modular redundancy (TMR). The voter function includes performing one or more operations in response to a result of the comparison that is performed.

In the example of FIG. 2, comparison circuit 130 is coupled to input ports 112, output port 114, and interrupt port 116. FUSA circuit 120 receives data on input ports 112-1, 112-2, and 112-3. Comparator circuit 130 compares the received data (e.g., the content or payload of the received lockstep data streams as appreciably data on different ports may have differing header information). The TMR data streams being compared may be generated by other circuits, systems, and/or applications implemented in TMR and operating concurrently (e.g., in lockstep). As such, the data compared on input ports 112-1, 112-2, and 112-3 is expected to be identical or match. FUSA circuit 120 is capable of generating different outputs on output port 114 based on a result of the comparison. Comparison circuit 130 is configured to compare the data received on input ports 112-1, 112-2, and 112-3. Comparison circuit 130 is configured to output, on output port 114, the majority data stream from input ports 112 based on the result of the comparison.

For example, in response to comparison circuit 130 determining that the data received on input ports 112-1, 112-2, and 112-3 matches, comparison circuit 130 outputs the data on output port 114. In one or more examples, in response to comparison circuit 130 determining that the data received on input ports 112-1, 112-2, and 112-3 does not match, e.g., detecting a fault, comparison circuit 130 outputs the data from two input ports 112 that does match. For example, if the data on input ports 112-1 and 112-2 matches and the data on input port 112-3 does not, comparison circuit 130 outputs the data from input ports 112-1 or 112-2. Further, in response to comparison circuit 130 detecting a fault, comparison circuit 130 may generate an interrupt signal on interrupt port 116 indicating the particular fault that was detected.

In one or more example implementations, in response to detecting a fault, comparison circuit 130 may ignore the data received on the input port found not to match. For example, continuing with the prior example, comparison circuit 130 may ignore data received on input port 112-3 for future comparisons. In other example implementations, in response to determining that no two input data streams match, comparison circuit 130 may not output any data and may also generate an interrupt indicating the particular type of fault that is detected.

As discussed, in one or more examples, ignoring an input port with data that is found not to match does not imply that the faulty data stream is no longer consumed. Were the faulty data no longer consumed by FUSA circuit 120 and/or comparison circuit 130, the faulty data stream would fill the stream network and block other correct data streams. Accordingly, the faulty data stream still may be consumed by FUSA circuit 120 and/or comparison circuit 130 presuming such data is available to prevent the faulty data stream from filling the stream network and blocking other correct data streams.

In one or more other examples, the voting function implemented by comparison circuit 130 may be activated or performed only in response to all received data streams having valid data as discussed in connection with FIG. 1. Further, a timeout timer circuit in communication with comparison circuit 130 may be included in FUSA circuit 120 and operate as previously described.

The programmability of programmable stream switch 102 allows data received on any three input ports 104 to be routed to output ports 110 to be provided to FUSA circuit 120 for processing. The output generated by FUSA circuit 120, at least in the case where the data matches or a majority data stream is determined, is output from output port 114 to input port 108. Appreciably, data received on input port 108 may be routed to any one of output ports 106 of programmable stream switch 102.

Inclusion of FUSA circuit 120 in communication with programmable stream switch 102 as shown allows FUSA functions, e.g., voter functions, to be incorporated into any of a variety of different circuit architectures. The programmability allows selected TMR data streams to be routed to FUSA circuit 120. The particular data streams that are routed to FUSA circuit 120 may be changed during runtime or operation of the IC in which architecture 100 is included as described in connection with FIG. 1.

In one or more example implementations, FUSA circuit 120 may be configured to begin operating as a voter circuit. In response to detecting a fault, FUSA circuit 120 may continue operating as a lockstep circuit (e.g., performing a lockstep function rather than a voter function) at least until FUSA circuit 120 is reset or reprogrammed.

The particular implementation of circuit architecture 100 that is used may depend on the particular application or context in which the system is to operate. For example, a lockstep function may be used in cases where error detection is a concern and the system determines the particular action to take in response to a detected fault. In other applications and contexts, timing and/or real-time operation may be larger concerns such that a voter function is desired so that the system may continue to operate without undertaking an immediate decision-making process as to how to handle a detected fault.

Figure 3:
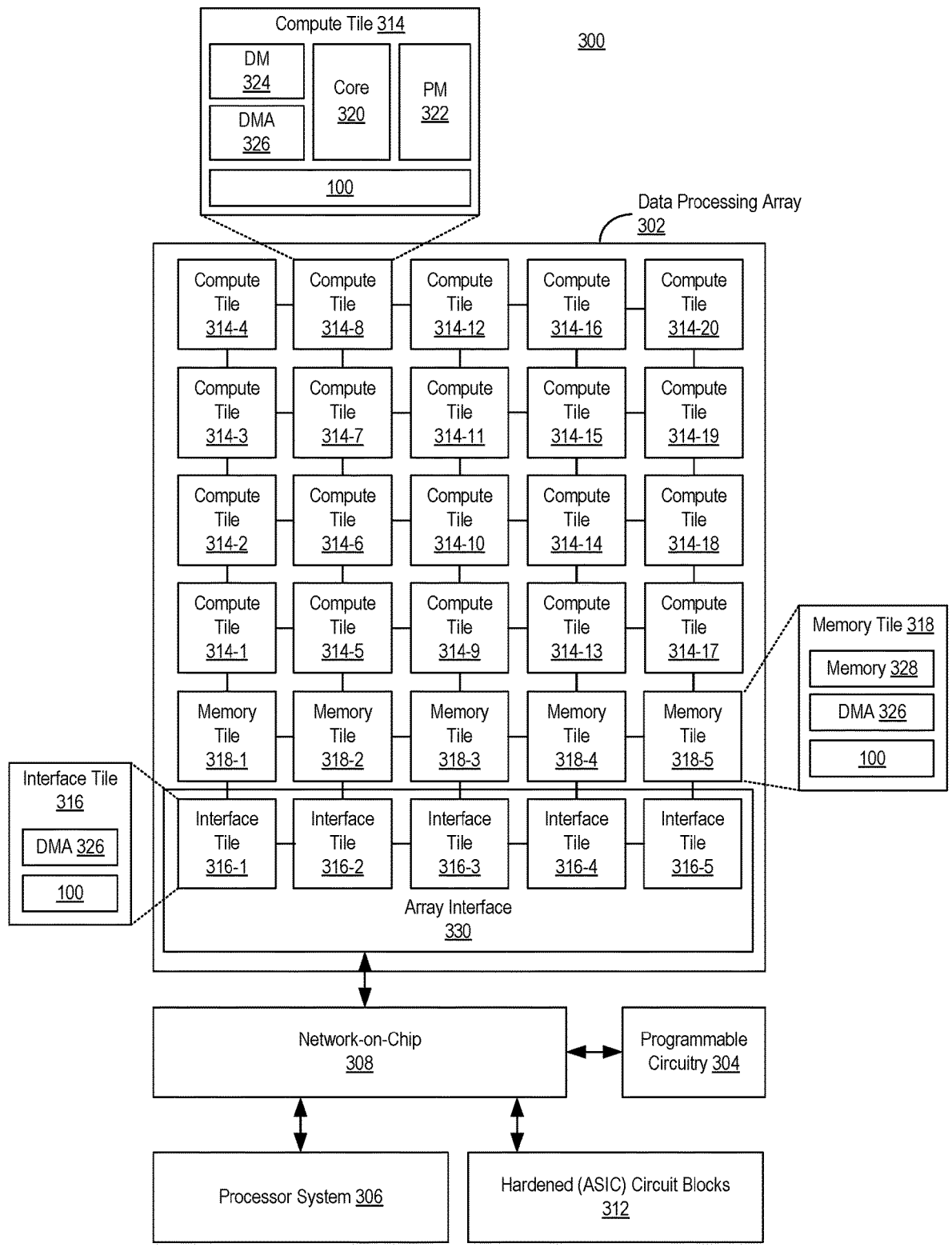
FIG. 3 illustrates an example architecture for an integrated circuit (IC) in which the example circuit architectures of FIGS. 1 and 2 may be included.

FIG. 3 illustrates an example architecture 300 for an IC in which the example circuit architectures of FIGS. 1 and 2 may be included. Architecture 300 may be used to implement a programmable IC, an adaptive system, and/or a System-on-Chip (SoC). In the example of FIG. 3, architecture 300 is implemented on a single die provided within a single package. In other examples, architecture 300 may be implemented using a plurality of interconnected dies within a single package where the various resources of architecture 300 (e.g., circuits) illustrated in FIG. 3 are implemented across the different interconnected dies.

In the example, architecture 300 includes a plurality of different subsystems including a data processing array 302, programmable circuitry 304, a processor system 306, a Network-on-Chip (NoC) 308, and one or more hardened circuit blocks 312. Architecture 300 may include fewer or more subsystems and/or subsystems of different varieties than shown.

Data processing array 302 may be implemented as a plurality of interconnected tiles. The term "tile," as used herein in connection with a data processing array, means a circuit block. The interconnected tiles of data processing array 302 include compute tiles 314 (e.g., 314-1, 314-2, 314-3, 314-4, 314-5, 314-6, 314-7, 314-8, 314-9, 314-10, 314-11, 314-12, 314-13, 314-14, 314-15, 314-16, 314-17, 314-18, 314-19, and 314-20), interface tiles 316 (e.g., 316-1, 316-2, 316-3, 316-4, 316-5), and optionally memory tiles 318 (e.g., 318-1, 318-2, 318-3, 318-4, and 318-5). The tiles illustrated in FIG. 3 may be arranged in an array or grid and are hardened.

Each compute tile 314 can include one or more cores 320, a program memory (PM) 322, a data memory (DM) 324, a DMA circuit 326, and optionally a circuit architecture 100 including a programmable stream switch 102 and FUSA circuit 120. In example implementations where functional safety circuitry is not needed within compute tiles 314, circuit architecture 100 may be replaced with a programmable stream switch 102. In one aspect, each core 320 is capable of executing program code stored in program memory 322. In one aspect, each core 320 may be implemented as a scalar processor, as a vector processor, or as a scalar processor and a vector processor operating in coordination with one another.

In one or more examples, each core 320 is capable of directly accessing the data memory 324 within the same compute tile 314 and the data memory 324 of any other compute tile 314 that is adjacent to the core 320 of the compute tile 314 in the north, south, west, and/or east directions. Core 320 sees data memories 324 within the same tile and in one or more other adjacent compute tiles as a unified region of memory (e.g., as a part of the local memory of the core 320). This facilitates data sharing among different compute tiles 314 in data processing array 302. In other examples, core 320 may be directly connected to data memories 324 in other compute tiles 314.

Compute tiles 314 also may communicate with one another via programmable stream switches 102 included therein. In doing so, any data that is routed to and/or from one or more of compute tiles 314 may flow through programmable stream switches 102 and/or FUSA circuits 120 so that FUSA functions may be applied to such data streams.

Cores 320 may be directly connected with adjacent cores 320 via core-to-core cascade connections (not shown). In one aspect, core-to-core cascade connections are unidirectional and direct connections between cores 320. In another aspect, core-to-core cascade connections are bidirectional and direct connections between cores 320. In general, core-to-core cascade connections allow the results stored in an accumulation register of a source core 320 to be provided directly to an input of a target or load core 320. This means that data provided over a cascade connection may be provided among cores directly with less latency since the data does not traverse the programmable stream switches 102 of circuit architectures 100 and is not written by a first core 320 to data memory 324 to be read by a different core 320.

In an example implementation, compute tiles 314 do not include cache memories. By omitting cache memories, data processing array 302 is capable of achieving predictable, e.g., deterministic, performance. Further, significant processing overhead is avoided since maintaining coherency among cache memories located in different compute tiles 314 is not required. In a further example, cores 320 do not have input interrupts. Thus, cores 320 are capable of operating uninterrupted. Omitting input interrupts to cores 320 also allows data processing array 302 to achieve predictable, e.g., deterministic, performance.

In the example of FIG. 3, each compute tile 314 may be implemented substantially identically to include the same hardware components and/or circuitry. Further, data processing array 302 may include an array of compute tiles formed of any of a variety of processing elements such as digital signal processing engines, cryptographic engines, Forward Error Correction (FEC) engines, or other specialized hardware for performing one or more specialized tasks.

In one or more other examples, compute tiles 314 may not be substantially identical. In this regard, compute tiles 314 may include a heterogeneous mix of compute tiles 314 formed of two or more different types of processing elements. As an illustrative and nonlimiting example, different ones of compute tiles 314 may include processing elements selected from two or more of the following groups: digital signal processing engines, cryptographic engines, Forward Error Correction (FEC) engines, or other specialized hardware.

In the example of FIG. 3, data processing array 302 optionally includes one or more memory tiles 318. Memory tiles 318 include a memory 328 (e.g., a RAM), a DMA circuit 326, and optionally circuit architecture 100 including a programmable stream switch 102 and FUSA circuit 120. In example implementations where functional safety circuitry is not needed within memory tiles 318, circuit architecture 100 may be replaced with a programmable stream switch 102. Each memory tile 318 may read and/or write to the memory 328 of an adjacent memory tile 318 by way of the DMA circuit 326 included in the memory tile 318. Further, data can be moved to/from the data memory 328 of any compute tile 318 (e.g., by the corresponding DMA circuit 326) from/to the memory 328 of any memory tile 318 (e.g., by the corresponding DMA circuit 326 or the DMA circuit 326 of an adjacent memory tile 318). In doing so, the data is routed through one or more of the programmable stream switches 102 and/or FUSA circuits 120 so that FUSA functions may be applied to such data streams. Memory tiles 318 are characterized by the lack of computational components such as processors (e.g., cores 320). In the example of FIG. 3, each memory tile 318 may be implemented substantially identically to include the same hardware components and/or circuitry. In one or more other examples, memory tiles 318 may not be substantially identical.

Interface tiles 316 form an array interface 330 for data processing array 302. Array interface 330 operates as an interface that connects tiles of data processing array 302 to other resources of the particular IC in which data processing array 302 is disposed and/or to other external (e.g., off-chip) systems. In the example of FIG. 3, array interface 330 includes a plurality of interface tiles 316 organized in a row. Interface tiles 316 can include a DMA circuit 326 and optionally circuit architecture 100 including a programmable stream switch 102 and FUSA circuit 120. In example implementations where functional safety circuitry is not needed within interface tiles 316, circuit architecture 100 may be replaced with a programmable stream switch 102. Interface tiles 316 are connected so that data may be propagated from one interface tile to another bi-directionally. Each interface tile 316 is capable of operating as an interface for the column of tiles directly above and is capable of interfacing such tiles with components and/or subsystems of the IC in which data processing array 302 is disposed.

In including circuit architecture 100 within interface tiles 316, any data that is routed through an interface tile 316 (whether to and/or from a compute tile 314, a memory tile 318, and/or other systems, circuits and/or applications external to data processing array 302) may flow through programmable stream switches 102 and/or FUSA circuits 120 so that FUSA functions may be applied to such data streams.

In the example of FIG. 3, array interface 330 (e.g., one or more of the interface tiles 316) communicatively links compute tiles 314 and/or memory tiles 318 with NoC 308, programmable circuitry 304, and/or other subsystems such as processor system 306 and/or hardened circuit blocks 312.

Programmable circuitry 304 is circuitry that may be programmed to perform specified functions. As an example, programmable circuitry 304 may be implemented as field programmable gate array type of circuitry. Programmable circuitry 304 can include an array of programmable circuit blocks. As defined herein, the term "programmable circuitry" means circuitry used to build reconfigurable digital circuits. Programmable circuitry, which may include programmable logic, is formed of many programmable circuit blocks that provide basic functionality. The topology of programmable circuitry 304 is highly configurable unlike hardened circuitry. In one aspect, each programmable circuit block of programmable circuitry 304 includes a programmable element (e.g., a functional element) and a programmable interconnect. The programmable interconnects provide the highly configurable topology of programmable circuitry 304. The programmable interconnects may be configured on a per wire basis to provide connectivity among the programmable elements of programmable circuit blocks of programmable circuitry 304 and is configurable on a per-bit basis (e.g., where each wire conveys a single bit of information) unlike connectivity among the compute tiles 314 and/or memory tiles 318 in data processing array 302, for example, that communicate by way of multi-bit data streams.

Examples of programmable circuit blocks of programmable circuitry 304 include configurable logic blocks having look-up tables (LUTs) and registers. Unlike hardened circuitry described below and sometimes referred to as hardened circuit blocks, these programmable circuit blocks have an undefined function at the time of manufacture. Programmable circuitry 304 may include other types of programmable circuit blocks that also provide basic and defined functionality with more limited programmability. Examples of these circuit blocks may include digital signal processing blocks (DSPs), phase lock loops (PLLs), Block RAMS (BRAMs), Ultra-RAMS (URAMs), and the like. These types of programmable circuit blocks, like others in programmable circuitry 304, are numerous and intermingled with the other programmable circuit blocks of programmable circuitry 304. These circuit blocks may also have an architecture that generally includes a programmable interconnect and a programmable element and, as such, are part of the highly configurable topology of programmable circuitry 304.

Prior to use, programmable circuitry 304, e.g., the programmable interconnect and the programmable elements, must be programmed or "configured" by loading data referred to as a configuration bitstream into internal configuration memory cells therein. The configuration memory cells, once loaded with a configuration bitstream, define how programmable circuitry 304 is configured, e.g., the topology, and operates (e.g., particular functions performed).

As noted, in one or more example implementations, programmable circuitry 304 may be configured to implement one or more programmable stream switches 102 and/or one or more FUSA circuits 120.

In one or more example implementations, data processing array 302 may be configured with one or more applications that implement different functions. In some cases, the applications may be duplicated or implemented in triplicate within data processing array 302. In such cases, where functional safety is desired, data streams that are intended to be duplicates or triplicates may be routed from programmable stream switches 102 to FUSA circuits 120 connected to the respective programmable stream switches 102 for performing lockstep and/or voting functions. In this regard, the FUSA mechanisms may be implemented in compute tiles 314, in interface tiles 316 (e.g., the point of entry and/or exit for data processing array 302), and/or in memory tiles 318.

In one or more example implementations, circuit architectures 100 may be used only in compute tiles 314, or only in interface tiles 316, or only in memory tiles 318. In one or more other example implementations, circuit architectures 100 may be implemented only in compute tiles 314 and interface tiles 316, or only in compute tiles 314 and memory tiles 318, or only in interface tiles 316 and memory tiles 318. It should be appreciated that circuit architectures 100 may be included in compute tiles 314, and in interface tiles 316, and in memory tiles 318. In still other example implementations, circuit architectures 100 may be incorporated only in selected ones (e.g., fewer than all) of compute tiles 314, interface tiles 316, and/or memory tiles 318.

Processor system 306 is implemented as hardened circuitry that is fabricated as part of architecture 300. Processor system 306 may be implemented as, or include, any of a variety of different processor types each capable of executing program code. For example, processor system 306 may be implemented as an individual processor, e.g., a single core capable of executing program code. In another example, processor system 306 may be implemented as a multi-core processor. In still another example, processor system 306 may include one or more cores, modules, co-processors, I/O interfaces, and/or other resources. Processor system 306 may be implemented using any of a variety of different types of architectures. Example architectures that may be used to implement processor system 306 may include, but are not limited to, an ARM processor architecture, an x86 processor architecture, a graphics processing unit (GPU) architecture, a mobile processor architecture, a DSP architecture, combinations of the foregoing architectures, or other suitable architecture that is capable of executing computer-readable instructions or program code.

NoC 308 is a programmable interconnecting network for sharing data between endpoint circuits in architecture 300. The endpoint circuits can be disposed in data processing array 302, programmable circuitry 304, processor system 306, and/or selected hardened circuit blocks 312. NoC 308 can include high-speed data paths with dedicated switching. In an example, NoC 308 includes one or more horizontal paths, one or more vertical paths, or both horizontal and vertical path(s). The arrangement and number of regions shown in FIG. 3 is merely an example. NoC 308 is an example of the common infrastructure that is available within architecture 300 to connect selected components and/or subsystems.

Nets that are to be routed through NoC 308 may be unknown until a design is created for implementation within architecture 300. NoC 308 may be programmed by loading configuration data into internal configuration registers that define how elements within NoC 308 such as switches and interfaces are configured and operate to pass data from switch to switch and among the NoC interfaces to connect the endpoint circuits. NoC 308 is also capable of dynamically routing data based on routing data included in headers of the data packets that traverse NoC 308. NoC 308 is fabricated as part of architecture 300 (e.g., is hardened) and, while not physically modifiable, may be programmed to establish logical connectivity between different master circuits and different slave circuits of a user circuit design. NoC 308, upon power-on, does not implement any user data paths or routes therein. Once configured, NoC 308 implements data paths or routes between endpoint circuits.

Hardened circuit blocks 312 are special-purpose circuit blocks fabricated as part of architecture 300. Though hardened, hardened circuit blocks 312 may be configured by loading configuration data into control registers to implement one or more different modes of operation. Examples of hardened circuit blocks 312 may include input/output (I/O) blocks, transceivers for sending and receiving signals to circuits and/or systems external to architecture 300, memory controllers, or the like. Examples of different I/O blocks may include single-ended and pseudo differential I/Os. Examples of transceivers may include high-speed differentially clocked transceivers. Other examples of hardened circuit blocks 312 include, but are not limited to, cryptographic engines, digital-to-analog converters (DACs), analog-to-digital converters (ADCs), and the like. In general, hardened circuit blocks 312 are application-specific circuit blocks.

The various programmable circuit resources illustrated in FIG. 3 may be programmed initially as part of a boot process for architecture 300. During runtime, the programmable circuit resources, including programmable stream switches 102 and/or FUSA circuits 120 of circuit architecture 100, may be reconfigured.

Figure 4:
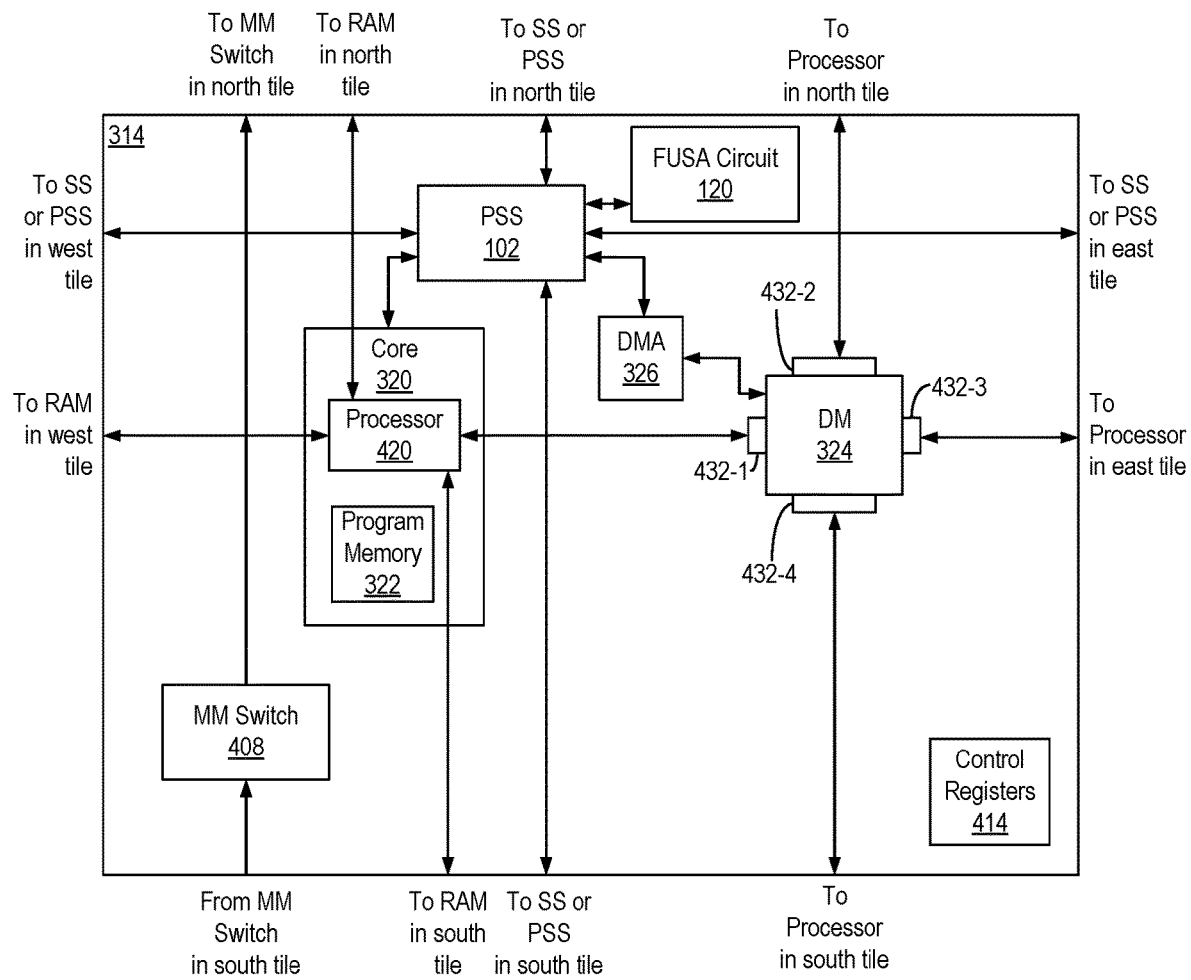
FIG. 4 illustrates an example implementation of a compute tile.

FIG. 4 illustrates an example implementation of a compute tile 314. The example of FIG. 4 is provided to illustrate certain architectural features of compute tiles 314 and not as a limitation of the form of data processing array 302 or the architecture of compute tiles 314 in general. Some connections between components and/or tiles are omitted for ease of illustration.

In the example, each compute tile 314 includes a core 320, a data memory 324, a programmable stream switch 102, a memory-mapped switch 408 (e.g., abbreviated as "MM" switch in the figures), control registers 414, and a DMA circuit 326. Core 320 includes a processor 420 and a program memory 322. Control registers 414 may be written by memory-mapped switch 408 to control the operation of the various components included in compute tile 314. Though not shown, each memory component of compute tile 314 (e.g., program memory 322, control registers 414, and data memory 324) may be read and/or written via memory-mapped switch 408 for purposes of configuration and/or initialization.

Processor 420 may be any of a variety of different processor types. In one aspect, processor 420 is implemented as a vector processor. In another example, processor 420 may be implemented as a scalar processor. In another example, processor 420 may include a vector processor and a scalar processor. Program memory 322 may be loaded, e.g., by way of loading an application, with executable instructions referred to as a "kernel." Each compute tile 314 is capable of performing data processing operations and operating on a large amount of data through execution of the kernel(s) stored in program memory 322 by processor 420.

Each core 320, e.g., processor 420, is directly connected to the data memory 324 located in the same compute tile 314 through a memory interface 432. Within this disclosure, a memory interface is referred to as a "local memory interface" when the memory interface is used by circuits in the same tile to access a memory or RAM. Memory interface 432-1 is an example of a local memory interface since processor 420 in the same tile utilizes the memory interface to access data memory 324. By comparison, a memory interface used by circuitry external to the tile to access data memory 324 is referred to as an adjacent memory interface. Memory interfaces 432-2, 432-3, and/or 432-4 are examples of adjacent memory interfaces because such memory interfaces are used by circuitry in other adjacent tiles to access data memory 324.

As such, each processor 420 is capable of accessing (e.g., reading and/or writing) the data memory 324 in the same compute tile 314 and one or more other data memories 324 in adjacent tiles via standard read and write operations directed to such memory interfaces. Data memory 324 is configured to store application data. Data memory 324 may be read and/or written via memory-mapped switch 408 for purposes of configuration and/or initialization. Data memory 324 may be read and/or written by a processor 420 and/or by DMA circuits 326 during runtime.

DMA circuit 326 is capable of reading and writing data to data memory 324 located in the same compute tile 314. DMA circuit 326 may receive data via programmable stream switch 102 from a source outside of compute tile 314 and store such data in data memory 324. DMA circuit 326 may read data from data memory 324 and output the data to programmable stream switch 102 for conveyance to one or more other destinations outside of compute tile 314. FUSA circuit 120 may be used to perform a FUSA function on any data that is received via programmable stream switch 120.

Each core 320, e.g., processor 420, may be directly connected to data memories 324 located in adjacent compute tiles 314 (e.g., in the north, south, east, and/or west directions) via memory interfaces 432. As such, processor 420 may directly access such other adjacent data memories 324 in the same manner as processor 420 is able to access the data memory 324 located in the same compute tile 314 without initiating read or write transactions over programmable stream switch 102 and/or without using DMA circuit 326. As an illustrative example, processor 420 of compute tile 316-5 may read and/or write to the data memory 324 located in compute tiles 314-5, 314-2, 314-4, and 314-6 without submitting read or write transactions over programmable stream switch 102 and/or using DMA circuits 326. It should be appreciated, however, that a processor 420 may initiate read and write transactions to the data memory 324 of any other compute tile 314 and/or memory tile 318 via programmable stream switch 102 and DMA circuits 326. Any data flowing through such programmable stream switches 102 may be processed using a corresponding FUSA circuit 120.

Processors 420 may also include direct connections, referred to as cascade connections (not shown), to processors 420 of adjacent cores (e.g., in the north, south, east, and/or west directions) that allow direct sharing of data stored in internal registers (e.g., an accumulation register) of processor 420 with other processors 420. This means that data stored in one or more internal registers of one processor 420 may be conveyed directly to one or more internal registers of a different processor 420 without first writing such data to data memory 324 and/or conveying such data over programmable stream switches 102 using DMA circuits 326.

In the example of FIG. 4, FUSA circuit 120 is capable of comparing data streams that originate in core 320 in the same compute tile 314, are read from data memory 324 in the same compute tile 314, originate from other tiles in data processing array 302 (e.g., compute tiles 314 and/or memory tiles 318), and/or any combination thereof. Further, FUSA circuit 120 may compare data streams received from other subsystems (e.g., circuits implemented in programmable circuitry 304 and/or hardened circuit blocks 312) of the IC, or any combination of the data sources mentioned.

Figure 5:
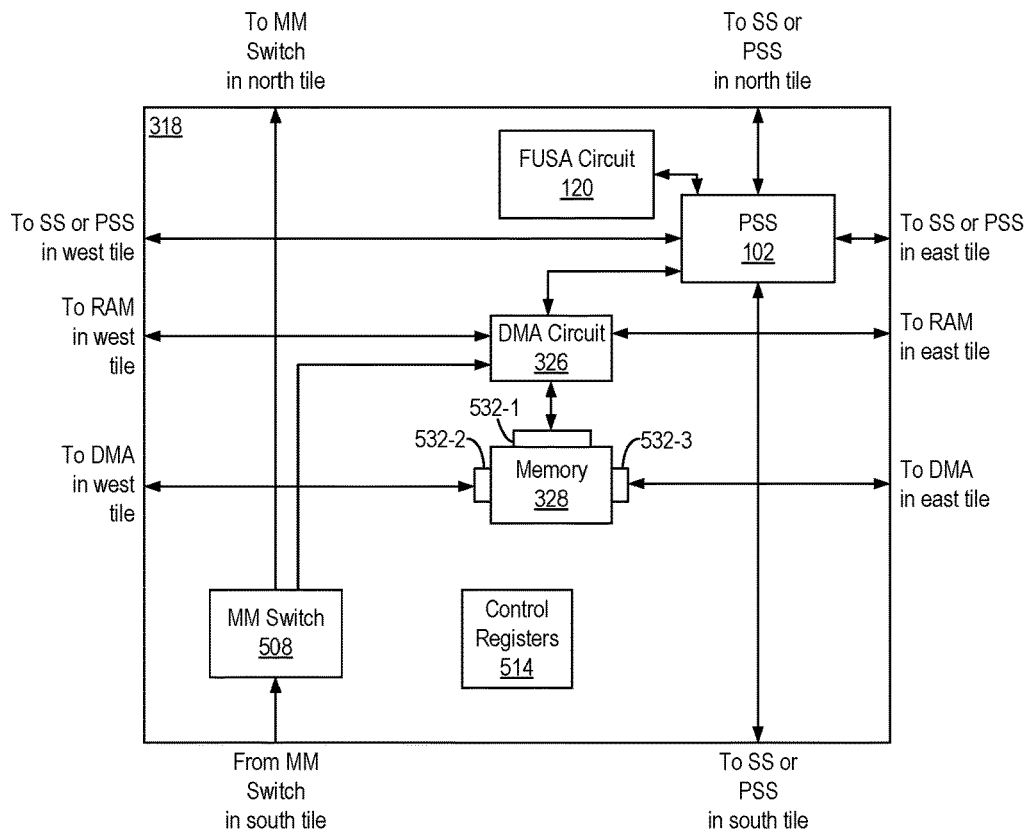
FIG. 5 illustrates an example implementation of a memory tile.

FIG. 5 illustrates an example implementation of a memory tile 318. The example of FIG. 5 is provided to illustrate certain architectural features of memory tiles 318 and not as a limitation of the form of data processing array 302 or architecture of memory tiles 318 in general. Some connections between components and/or tiles are omitted for ease of illustration.

Each memory tile 318 includes a DMA circuit 326, a memory 328, a circuit architecture 100 including programmable stream switch 102 and FUSA circuit 120, a memory-mapped switch 508, and/or control registers 514. Control registers 514 may be written by memory-mapped switch 508 to control the operation of the various components illustrated in memory tile 318. Though not shown, each memory component of memory tile 318 (e.g., memory 328 and control registers 514) may be read and/or written via memory-mapped switch 508 for purposes of configuration and/or initialization.

Each DMA circuit 326 of a memory tile 318 is coupled to the memory 328 within the same memory tile 318 via a local memory interface 532-1 and may be coupled to one or more memories 328 of other adjacent memory tiles 318. In the example of FIG. 5, each DMA circuit 326 is capable of accessing (e.g., reading and/or writing) the memory 328 included within the same memory tile 318 via local memory interface 532-1. Memory 328 includes adjacent memory interfaces 532-2 and 532-3 through which the DMA circuits of the east and west memory tiles 318 may access memory 328. For example, the DMA circuit 326 of memory tile 318-2 may access the memory 328 of memory tile 318-1 and/or the memory 328 of memory tile 318-3. DMA circuit 326 in the example may read and/or write memories of adjacent memory tiles 318 by way of adjacent memory interfaces of the RAMs of such other memory tiles. DMA circuit 326 may place data read from memory 328 onto programmable stream switch 102 and write data received via programmable stream switch 102 to memory 328.

Similar to the example of FIG. 4, memory-mapped switch 508 is used for purposes of configuration and initialization of memory tile 318 and programmable stream switch 102 is used for conveying data during runtime. In one aspect, memory 328 may be initialized as part of the process of loading an application into data processing array 302. Loading an application also loads configuration data into control registers 514 that configure stream programmable stream switch 102 to implement the stream channels.

In the example of FIG. 5, FUSA circuit 120 is capable of performing a FUSA function on any data that enters the corresponding programmable stream switch 102. Thus, FUSA circuit 120 is capable of comparing data streams that originate from DMA circuit 326 in the same memory tile 318 (whether accessing memory 328 in the same memory tile 318 or memory 328 from a different memory tile), from other compute tiles 314 and/or memory tiles 318, and/or from other subsystems as received via interface tiles 316. For example, FUSA circuit 120 may compare data streams received from other subsystems (e.g., circuits implemented in programmable circuitry 304 and/or hardened circuit blocks 312) of the IC, or any combination of the data sources mentioned.

In the examples described herein, certain tiles may include one or more common or similar components such as memory-mapped switches, stream switches, and/or DMA circuits. It should be appreciated, however, that memory tiles 318 are generally characterized by the lack of a processing element (e.g., processor 420) included therein.

Figure 6:
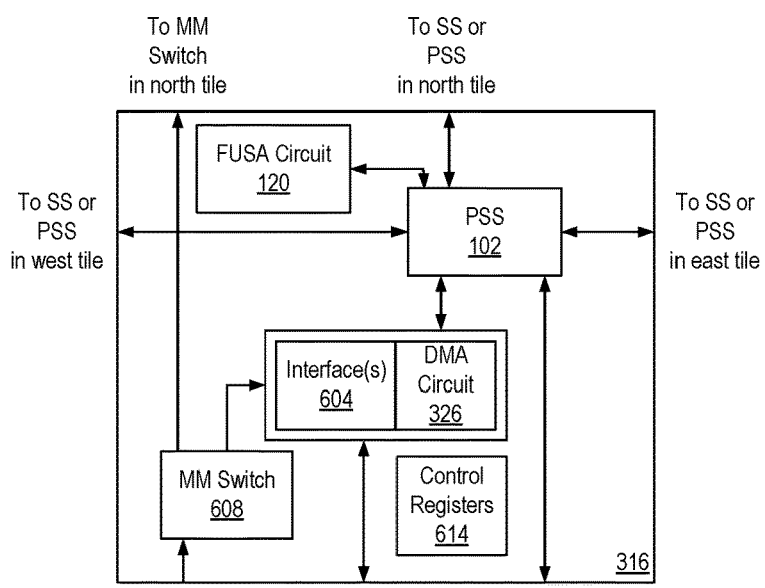
FIG. 6 illustrates an example implementation of an interface tile.

FIG. 6 illustrates an example implementation of an interface tile 316. The example of FIG. 6 is provided to illustrate certain architectural features of interface tiles 316 and not as a limitation of the form of data processing array 302. Some connections between components and/or tiles are omitted for ease of illustration.

In the example, each interface tile 316 includes a DMA circuit 326, one or more interfaces 604, a circuit architecture 100 including programmable stream switch 102 and FUSA circuit 120, a memory-mapped switch 608, and control registers 614. In other example implementations, not every interface tile 316 includes a DMA circuit 326. Array interface 330 is operative as an interface between array tiles of data processing array 302 and other circuits of architecture 300 and/or circuits external to architecture 300 (e.g., off-chip circuits and/or systems). In the example of FIG. 6, interface tiles 316 couple to memory tiles 318. In other example implementations, interface tiles 316 couple to compute tiles 314 depending on whether data processing array 302 includes memory tiles 318 and/or the location of such memory tiles 318 within data processing array 302.

In the example of FIG. 6, interface(s) 604 are capable of connecting to other systems and/or circuits of the system. For purposes of illustration, interface(s) 604 are capable of coupling to NoC 308, to programmable circuitry 304, to processor system 306, and/or one or more other hardened circuit blocks 312. In another arrangement, interfaces 604 may be configured to communicate with circuits and/or systems located in the same package as data processing array 302 but implemented in a different die within the package. In still another arrangement, interfaces 604 may be configured to communicate with circuits and/or systems located external to the IC that includes data processing array 302 (e.g., to circuits and/or systems external to the package).

Interface tiles 316 are capable of conveying data, whether application runtime data via programmable stream switch 102 or configuration data via memory-mapped switches 608, to the array tiles located above each respective interface tile 316 as received from other circuit sources and/or send such data out to other circuits. Further, interface tiles 316 are configurable by loading an application (e.g., including configuration data) into control registers 614 of each respective interface tile 316 by way of memory-mapped switches 608.

In the example of FIG. 6, FUSA circuit 120 is capable of comparing data streams received by the corresponding programmable stream switch 102. Such data streams include data streams that pass through interface tiles 316 despite the source or point of origination of such data streams. Including functional safety circuits 120 within interface tiles 316 allows any data stream entering and/or exiting data processing array 302 to be checked for functional safety.

Within data processing array 302, taken collectively, the programmable stream switches 102 form a stream network that is capable of conveying application runtime data (as differentiated from configuration data). Application runtime data includes data that is received, operated on, or generated (e.g., output) by an array tile (e.g., a compute tile 314) of data processing array 302 during runtime of an application. Application runtime data is generally stored, during runtime, in data memories 324 and/or memories 328 and conveyed over the stream channels implemented by the programmable stream switches 102. The inclusion of FUSA circuits 120 connected to one or more or all of the programmable stream switches 102 allows FUSA functions such as lockstep and/or voting to be implemented at any of a variety of different locations throughout data processing array 302.

Taken collectively, the memory-mapped switches (408, 508, and 608) form a memory-mapped network through which an application and/or configuration data may be loaded into data processing array 302.

Figure 7:
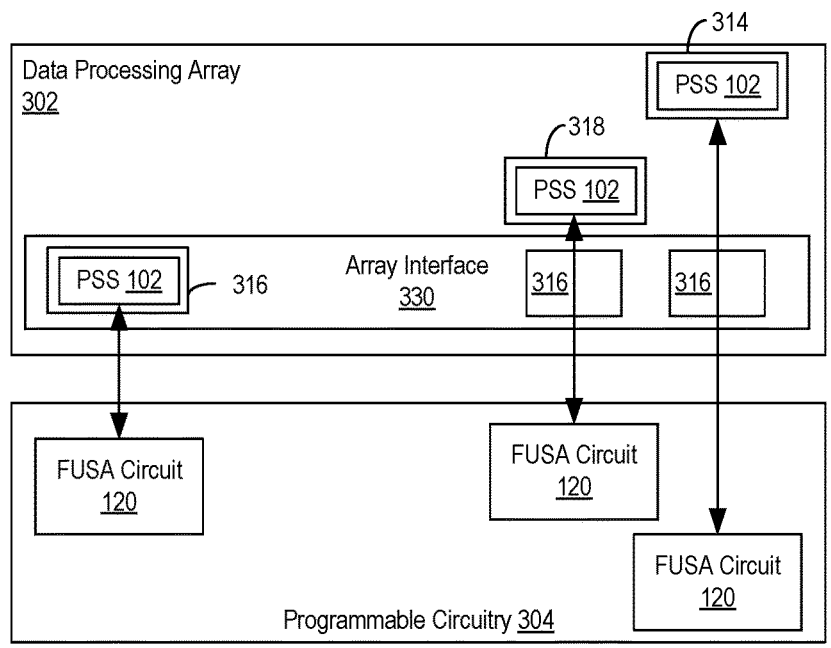
FIG. 7 illustrates another example implementation of an architecture for an IC.

FIG. 7 illustrates another example implementation of architecture 300. In the example of FIG. 7, a programmable stream switch 102 may be implemented within an interface tile 316, a compute tile 314, and/or a memory tile 318. Each of the programmable stream switches 102 illustrated may connect to a respective FUSA circuit 120 implemented in programmable circuitry 304. The example of FIG. 7 illustrates one technique for adding FUSA mechanisms to programmable stream switches that are implemented without corresponding, hardened FUSA circuits. In the example, FUSA circuits 120 may be implemented in programmable circuitry and connect to the programmable stream switch 102 via interconnect circuitry such as NoC 308 and/or directly through interface tiles 316.

Figure 8:
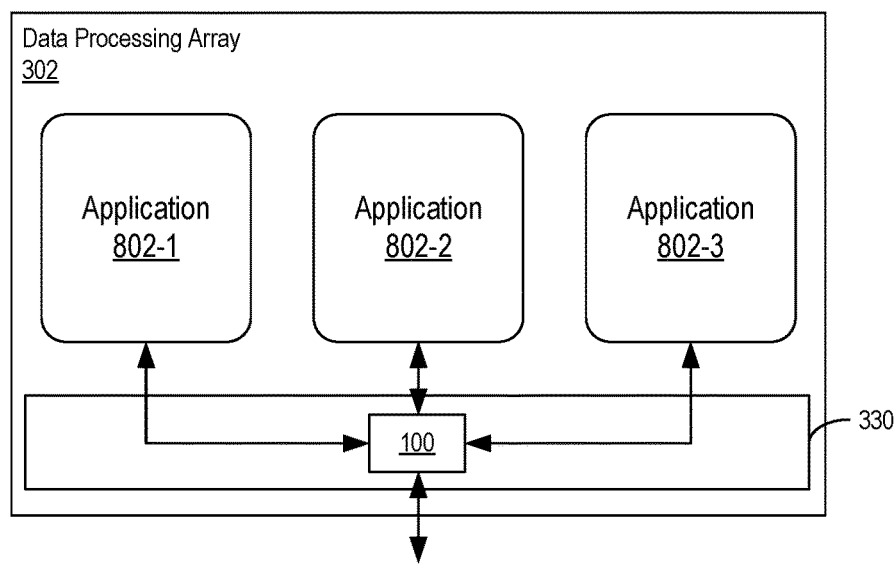
FIG. 8 illustrates an example IC running multiple instances of an application using the circuit architectures of FIGS. 1 and 2.

FIG. 8 illustrates an example where multiple instances of an application 802 (e.g., 802-1, 802-2, and 802-3) are implemented and running concurrently in lockstep in data processing array 302. Each instance may be functionally isolated from the others as part of a TMR implementation. Each different instance 802 may operate independently of the other instance, though in lockstep. Within this disclosure, it should be appreciated that two or more entities operating in lockstep means that such entities operate in a synchronized manner, which is to be differentiated from a lockstep function that involves comparing data output from two entities. In the example, each instance 802 outputs data to circuit architecture 100. Circuit architecture 100 may ensure that data entering to and/or exiting from each respective instance of application 802 is accurate (e.g., fault free).

In the example, circuit architecture 100 is implemented in array interface 330. It should be appreciated that circuit architecture 100 may be implemented in a different tile and/or in programmable circuitry 304. In the example, in response to detecting a fault, circuit architecture 100 may generate an interrupt to another system (e.g., the processor system 306, an external host system, a hardened circuit block 312, or other circuit). Circuit architecture 100 may also begin ignoring input from the particular instance 802 that provided non-matching data and operate to perform a lockstep function.

In another example, instance 802-3 may be omitted such that circuit architecture 100 performs a lockstep function.

It should be appreciated that the various example implementations described herein may selectively perform the FUSA functions described herein. That is, though the connections between programmable stream switch 102 and FUSA circuit 120 may be hardened (except in cases where one or both of programmable stream switch 102 and/or FUSA circuit 120 is/are implemented in programmable circuitry), the FUSA functions of FUSA circuit 120 may be used or not based on the programming of programmable stream switch 102. To utilize the FUSA functions of FUSA circuit 120, programmable stream switch 102 need only be programmed to route two or more data streams to FUSA circuit 120. To discontinue using FUSA functions of FUSA circuit 120, programmable stream switch 102 need only be programmed to discontinue routing the data streams to FUSA circuit 120. Such programming of programmable stream switch 102 may be performed dynamically during runtime of the IC including circuit architecture 100 by writing updated configuration data to the configuration registers of programmable stream switch 102 and/or by using dynamic routing where the routing of data packets is specified by routing data included in the header portion of the data packets.

In one or more example implementations, the FUSA circuit 120 as described in connection with FIG. 2 may be programmed to implement a lockstep function using only two of input ports 112 or perform a voting function by using each of input ports 112. The programming of FUSA circuit 120 (and programmable stream switch 102) may be performed dynamically (e.g., in real-time) during runtime to move or switch operation of FUSA circuit 120 between performing a lockstep function or a voting function.

In one or more other example implementations, FUSA circuit 120 may be configured to modify, update, remove, or add header information to data packets that are compared. For example, FUSA circuit 120 may update header information to control dynamic routing of such data packets through other portions of the stream network formed by programmable stream switches 102.

The terminology used herein is for the purpose of describing particular embodiments only and is not intended to be limiting. Notwithstanding, several definitions that apply throughout this document are expressly defined as follows.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "individual" and "user" each refer to a human being.

As defined herein, the terms "one embodiment," "an embodiment," "in one or more embodiments," "in particular embodiments," or similar language mean that a particular feature, structure, or characteristic described in connection with the embodiment is included in at least one embodiment described within this disclosure. Thus, appearances of the aforementioned phrases and/or similar language throughout this disclosure may, but do not necessarily, all refer to the same embodiment.

As defined herein, the term "real-time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit, comprising:
    a plurality of compute tiles in a data processing array, each compute tile configured to perform a data processing function; and
    a plurality of interface tiles in the data processing array, the plurality of interface tiles communicatively linked to the plurality of compute tiles;
    a plurality of programmable stream switches disposed in the plurality of compute tiles and the plurality of interface tiles; and
    a functional safety circuit connected to a selected programmable stream switch of the plurality of programmable stream switches; and
    wherein the functional safety circuit is configured to perform a functional safety function on a plurality of data streams routed to the functional safety circuit from the selected programmable stream switch.

2. The integrated circuit of claim 1, wherein the selected programmable stream switch includes a plurality of input ports and a plurality of output ports, wherein at least two of the plurality of output ports and at least one of the plurality of input ports are connected to the functional safety circuit.

3. The integrated circuit of claim 2, wherein the selected programmable stream switch is programmable to route data received on any input port to the at least two of the plurality of output ports connected to the functional safety circuit.

4. The integrated circuit of claim 3, wherein the selected programmable stream switch is programmable to route data received on the at least one input port of the plurality of input ports connected to the functional safety circuit to a selected output port of the plurality of output ports of the selected programmable stream switch.

5. The integrated circuit of claim 3, wherein, in response to detecting a fault, the functional safety circuit ignores an input port on which the fault is detected for subsequent voting operations.

6. The integrated circuit of claim 5, wherein the functional safety circuit, subsequent to detecting the fault, performs a lockstep function.

7. The integrated circuit of claim 1, wherein the functional safety circuit is a lockstep circuit.

8. The integrated circuit of claim 1, wherein the functional safety circuit is a voting circuit.

9. The integrated circuit of claim 1, wherein the functional safety circuit is configured to generate an interrupt in response to detecting a fault.

10. The integrated circuit of claim 9, wherein, in response to detecting the fault, the functional safety circuit does not pass any output.

11. The integrated circuit of claim 1, wherein the functional safety circuit is programmable to implement a lockstep function or a voting function.

12. The integrated circuit of claim 1, wherein the data processing array includes a plurality of memory tiles each including a programmable stream switch, wherein one or more selected programmable stream switches disposed in the plurality of memory tiles are connected to functional safety circuits.

13. The integrated circuit of claim 1, wherein the functional safety circuit is implemented in programmable circuitry coupled to the data processing array.

14. An integrated circuit, comprising:
    a programmable stream switch having a plurality of input ports and a plurality of output ports; and
    a functional safety circuit having a plurality of input ports and an output port, wherein the plurality of input ports of the functional safety circuit are connected to two or more output ports of the plurality of output ports of the programmable stream switch and wherein the output port of the functional safety circuit is connected to an input port of the plurality of input ports of the programmable stream switch; and
    wherein the programmable stream switch is programmable to connect different ones of the plurality of input ports to different ones of the plurality of output ports to implement a functional safety function on two or more data streams received by the programmable stream switch.

15. The integrated circuit of claim 14, wherein the functional safety circuit is a lockstep circuit.

16. The integrated circuit of claim 14, wherein the functional safety circuit is a voting circuit.

17. The integrated circuit of claim 14, wherein the programmable stream switch is a hardened circuit and the functional safety circuit is implemented in programmable circuitry.

18. The integrated circuit of claim 14, wherein the programmable stream switch is a hardened circuit and the functional safety circuit is a hardened circuit.

19. The integrated circuit of claim 14, wherein the programmable stream switch is implemented in programmable circuitry and the functional safety circuit is implemented in programmable circuitry.

20. The integrated circuit of claim 14, wherein the functional safety circuit is configured to generate an interrupt in response to detecting a fault.

* * * * *